(12) United States Patent
Kim et al.

(10) Patent No.: US 9,074,491 B2
(45) Date of Patent: Jul. 7, 2015

(54) STEAM CYCLE SYSTEM WITH THERMOELECTRIC GENERATOR

(75) Inventors: Kihyung Kim, Atlanta, GA (US); Seyfettin Can Gulen, Niskayuna, NY (US)

(73) Assignee: General Electric Company, Schenectady, NY (US)

( * ) Notice: Subject to any disclaimer, the term of this patent is extended or adjusted under 35 U.S.C. 154(b) by 175 days.

(21) Appl. No.: 13/603,463

(22) Filed: Sep. 5, 2012

(65) Prior Publication Data

US 2014/0060047 A1    Mar. 6, 2014

(51) Int. Cl.
| | |
|---|---|
| F01K 13/02 | (2006.01) |
| H01L 35/30 | (2006.01) |
| F01K 7/22 | (2006.01) |
| H01L 35/00 | (2006.01) |
| F01K 23/10 | (2006.01) |

(52) U.S. Cl.
CPC . *F01K 7/22* (2013.01); *H01L 35/00* (2013.01); *F01K 23/10* (2013.01); *Y02E 20/16* (2013.01)

(58) Field of Classification Search
CPC ....... F01K 13/00; F01K 13/006; F01K 13/02; F23M 2900/13003; H01L 35/00; H01L 35/28–35/325; F02G 5/02; Y02T 10/166
USPC .............. 60/643–681, 685, 690; 290/1 R, 52; 136/205–212, 201
See application file for complete search history.

(56) References Cited

U.S. PATENT DOCUMENTS

| | | | |
|---|---|---|---|
| 3,877,835 A | 4/1975 | Siptrott | |
| 4,436,480 A | 3/1984 | Vary | |
| 5,905,311 A | 5/1999 | Hess et al. | |
| 6,269,645 B1 * | 8/2001 | Yamaguchi | ..................... 60/653 |
| 6,420,794 B1 | 7/2002 | Cao | |
| 7,608,777 B2 | 10/2009 | Bell et al. | |
| 7,921,640 B2 | 4/2011 | Major | |
| 8,102,068 B1 | 1/2012 | Gutekunst | |
| 8,549,835 B2 * | 10/2013 | Richter | .......................... 60/275 |
| 2004/0045594 A1 | 3/2004 | Hightower | |
| 2007/0017207 A1 * | 1/2007 | Smith et al. | ................ 60/39.182 |
| 2009/0090111 A1 | 4/2009 | Tomlinson et al. | |
| 2010/0024383 A1 | 2/2010 | Chandrabose et al. | |
| 2010/0242430 A1 | 9/2010 | Hu et al. | |

(Continued)

FOREIGN PATENT DOCUMENTS

| | | |
|---|---|---|
| CN | 201053371 Y | 4/2008 |
| CN | 101769222 A | 7/2010 |

(Continued)

OTHER PUBLICATIONS

U.S. Appl. No. 13/355,581, filed Jan. 23, 2012, Saha, et al.

*Primary Examiner* — Thomas Denion
*Assistant Examiner* — Laert Dounis
(74) *Attorney, Agent, or Firm* — Sutherland Asbill & Brennan LLP

(57) ABSTRACT

The present application provides a steam cycle system. The steam cycle system may include a source of steam, a steam turbine, a condenser, a steam turbine bypass system such that steam from the source of steam may bypass the steam turbine and be routed to the condenser, and one or more thermoelectric generators positioned about the steam turbine bypass system. The one or more thermoelectric generators may generate a direct current based upon temperature differences between steam and water of the steam cycle system.

20 Claims, 3 Drawing Sheets

(56) References Cited

U.S. PATENT DOCUMENTS

| | | |
|---|---|---|
| 2010/0269878 A1 | 10/2010 | Kuhlbach |
| 2010/0281866 A1 | 11/2010 | Reynolds et al. |
| 2011/0088404 A1 | 4/2011 | Gulen |
| 2011/0113786 A1 | 5/2011 | Rancruel et al. |
| 2011/0185744 A1 | 8/2011 | Tong et al. |
| 2011/0209479 A1 | 9/2011 | Tong et al. |
| 2012/0055157 A1 | 3/2012 | Gulen et al. |
| 2013/0219872 A1* | 8/2013 | Gibble et al. .................. 60/320 |
| 2014/0000668 A1* | 1/2014 | Lessard ........................ 136/201 |

FOREIGN PATENT DOCUMENTS

| | | |
|---|---|---|
| DE | 102010048888 A1 * | 4/2012 |
| GR | 1005088 B1 | 12/2005 |
| GR | 1005843 B1 | 3/2008 |
| JP | 2008298009 A | 12/2008 |
| JP | 2011137439 A | 7/2011 |
| JP | 2011140956 A | 7/2011 |
| WO | 2004005708 A2 | 1/2004 |
| WO | 2011010675 A1 | 1/2011 |

* cited by examiner

US 9,074,491 B2

STEAM CYCLE SYSTEM WITH THERMOELECTRIC GENERATOR

TECHNICAL FIELD

The present application and the resultant patent relate generally to turbo-machinery and more particularly relate to a steam cycle system with one or more thermoelectric generators driven by steam turbine bypass steam for supplemental power generation.

BACKGROUND OF THE INVENTION

Generally described, a combined cycle system uses a combination of a gas turbine and a steam turbine to produce electrical power or otherwise drive a load. Specifically, a gas turbine cycle may be operatively combined with a steam turbine cycle by way of a heat recovery steam generator and the like. The heat recovery steam generator is a heat exchanger that allows feed water for the steam generation process to be heated by the hot combustion gases of the gas turbine exhaust. The primary efficiency of the combined cycle system arrangement is the utilization of the otherwise "wasted" heat of the gas turbine engine exhaust. Specifically, the efficiency of the heat recovery steam generator depends on the heat transfer between the gas turbine combustion gases ("the hot side") and the feed water and the steam ("the cold side"). The design aim is to generate maximum possible useful work from the heat in the gas turbine exhaust.

Although a combined cycle system is efficient, there are numerous types of parasitic losses as well as routine operating losses. For example, one source of wasted energy is the flow of hot, high pressure steam that bypasses the steam turbine during startup, shutdown, and contingency events. Instead of producing useful work, this flow of steam is generally routed directly to the condenser. In fact, this flow of steam is generally attemperated with feed water to drop the temperature below a required condition.

There is thus a desire for an improved combined cycle system with reduced parasitic and operating losses. Preferably, otherwise wasted flows of hot, high pressure steam may provide useful work for supplemental power generation and improved overall efficiency.

SUMMARY OF THE INVENTION

The present application and the resultant patent thus provide a steam cycle system. The steam cycle system may include a source of steam, a steam turbine, a condenser, a steam turbine bypass system such that steam from the source of steam may bypass the steam turbine and be routed to the condenser, and one or more thermoelectric generators positioned about the steam turbine bypass system.

The present application and the resultant patent further provide a method of producing supplemental power in a steam cycle system. The method may include the steps of routing hot steam through a bypass line in a steam turbine bypass system, routing feed water in a feed water line to attemperate the hot steam in the bypass line of the steam turbine bypass system, positioning a thermoelectric generator about the bypass line and the feed water line, and generating power based upon a temperature difference between the hot steam and the feed water.

The present application and the resultant patent further provide a vapor cycle system. The vapor cycle system may include a heat source, one or more expanders, a condenser, a bypass system such that vapor from the heat source may bypass the one or more expanders and be routed to the condenser, and one or more thermoelectric generators positioned about the bypass system.

These and other features and improvements of the present application and the resultant patent will become apparent to one of ordinary skill in the art upon review of the following detailed description when taken in conjunction with the several drawings and the appended claims.

DETAILED DESCRIPTION

Figure 1:
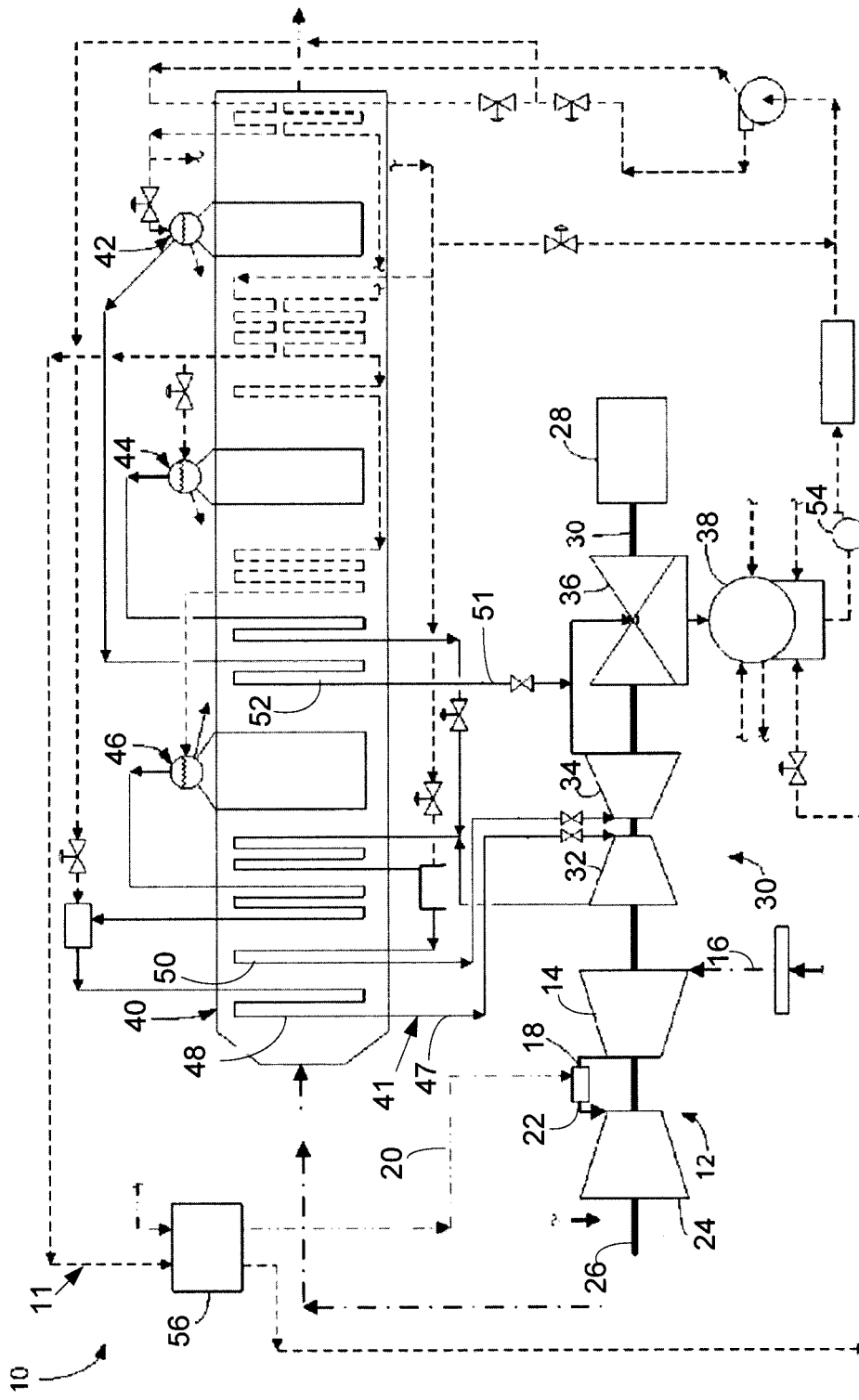
FIG. 1 is a schematic diagram of a combined cycle system with a gas turbine engine, a steam turbine, and a heat recovery steam generator.

Referring now to the drawings, in which like numerals refer to like elements throughout the several views, FIG. 1 shows a schematic diagram of a steam cycle system 10. The steam cycle system 10 in this example may be a combined cycle system 11. The combined cycle system 11 may include a gas turbine engine 12. The gas turbine engine 12 may include a compressor 14. The compressor 14 compresses an incoming flow of air 16. The compressor 14 delivers the compressed flow of air 16 to a combustor 18. The combustor 18 mixes the compressed flow of air 16 with a pressurized flow of fuel 20 and ignites the mixture to create a flow of combustion gases 22. Although only a single combustor 18 is shown, the gas turbine engine 12 may include any number of combustors 18. The flow of combustion gases 22 is in turn delivered to a turbine 24. The flow of combustion gases 22 drives the turbine 24 so as to produce mechanical work. The mechanical work produced in the turbine 24 drives the compressor 14 via a shaft 26 and an external load 28 such as an electrical generator and the like. The gas turbine engine 12 may use natural gas, various types of syngas, and other types of fuels. The gas turbine engine 12 may have different configurations and may use other types of components.

The combined cycle system 11 also includes a steam turbine 30. The steam turbine 30 may include a high pressure section 32, an intermediate pressure section 34, and one or more low pressure sections 36 with multiple steam admission points at different pressures. The low pressure section 36 may exhaust into a condenser 38. One or multiple shafts 26 may be used herein. Other configurations and other components also may be used herein.

The combined cycle system 10 also may include a heat recovery steam generator 40. The heat recovery steam generator 40 may include a number of steam sources 41 such as a low pressure section 42, an intermediate pressure section 44, and a high pressure section 46. Each section 42, 44, 46 generally includes one or more drums, economizers, evaporators, and/or superheaters. In this example and in addition to other components, the high pressure section 46 may include a source of high pressure steam 47 such as a high pressure superheater 48, the intermediate pressure section 44 may include a reheater 50, and the low pressure section 42 may include a source of low pressure steam 51 such as a low pressure superheater 52.

Feed water from the condenser 38 may be fed to the heat recovery steam generator 40 via a condensate pump 54. The flow of feed water passes through the sections 42, 44, 46 of the heat recovery steam generator 40 and exchanges heat with the flow of combustion gases 22 from the gas turbine engine 12. The steam produced in the heat recovery steam generator 40 then may be used to drive the steam turbine 30. Likewise, hot, high pressure water produced in the heat recovery steam generator may be used in a performance heater 56 to heat the incoming flow of fuel 20 to the combustor 18. The water used in the performance heater 56 generally is dumped to the condenser 38 after use. This description of the combined cycle system 10 is for the purpose of example only. Many other components and other configurations may be used herein.

Figure 2:
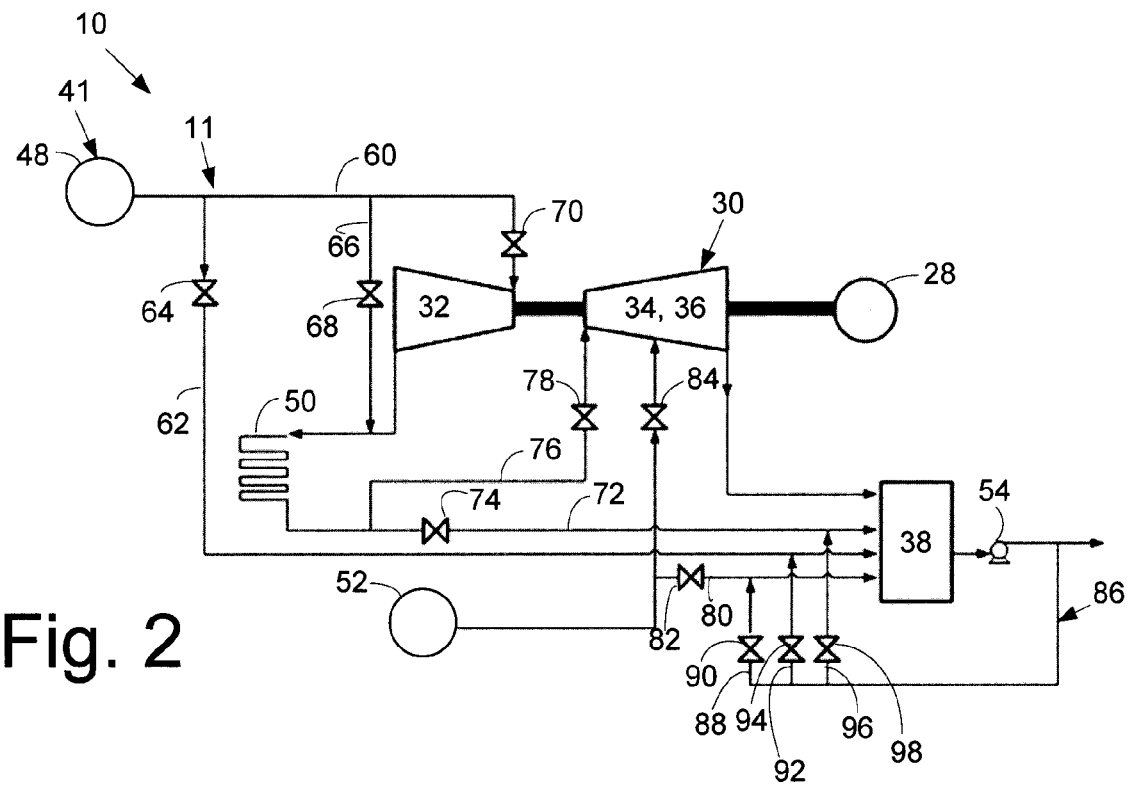
FIG. 2 is a schematic diagram of a steam turbine bypass system that may be used with the combined cycle system of FIG. 1.

FIG. 2 shows a steam turbine bypass system 60 that may be used with the steam cycle system 10. The steam turbine bypass system 66 allows the flows of steam from the high pressure superheater 48 and the low pressure superheater 52 to bypass the steam turbine 30 and flow directly to the condenser 38. The steam turbine bypass system 60 may include one or more high pressure bypass lines 61. The high pressure bypass lines 61 may include a parallel bypass line 62 with a parallel bypass valve 64 and/or a cascade bypass line 66 with a cascade bypass valve 68.

The parallel bypass line 62 and/or the bypass cascade bypass line 66 may be positioned upstream of a control valve 70 about an entry into the high pressure section 32 of the steam turbine 30. The parallel bypass line 62 may be routed directly to the condenser 38. The cascade bypass line 66 may be routed first to the reheater 50 and then on to the condenser 38 via a hot reheat bypass line 72 with a hot reheat bypass valve 74 thereon. A return line 76 with a return valve 78 may be positioned downstream of the reheater 50 and extend towards an entry to the intermediate pressure section 34 or the low pressure section 36 of the steam turbine 30.

The steam turbine bypass system 60 also may include a low pressure bypass line 80 with a low pressure bypass valve 82 extending from the low pressure superheater 52 to the condenser 38. The low pressure bypass line 80 may be positioned just upstream of an admission valve 84 positioned about an entry to the intermediate pressure section 34 or the low pressure section 36.

Each of the bypass lines 62, 72, 80 may merge with an attemperating water line 86 in communication with the condenser 38 and the condensate pump 54. Other sources of cool water may be used herein. A condensate water line 88 with a low pressure condensate water valve 90 may be positioned about the low pressure bypass line 80, a hot reheat feed water line 96 with a hot reheat feed water valve 98 may be positioned about the hot reheat bypass line 72, and a high pressure feed line 92 with a high pressure feed water valve 94 may be positioned about the parallel bypass line 62 or other type of high pressure bypass line 61. Other types of feed water lines may be used herein. Other components and other configurations also may be used herein.

Generally described, high pressure steam from the superheater 48 may be routed directly to the condenser 38 via a parallel bypass valve 64. This high pressure flow may be merged with a flow of feed water via the high pressure flow line 92. The flow of steam is first routed through the reheater 50. The hot reheat valve 74 is also opened such that the flow then passes through the hot reheat bypass line 72 towards the condenser 38. The flow may be mixed with a flow of feed water via the hot reheat flow line 96. In either case, the admission valve 84 to the intermediate pressure section 34 and/or the low pressure section 36 is closed and the low pressure bypass valve 82 is opened. The flow of low pressure steam from the low pressure superheater 52 is routed through the low pressure bypass line 80 to the condenser 38. This flow also may be mixed with a flow of condenser feed water via the low pressure condensate water line 88. Other configurations and other types of steam bypass schemes may be used.

Figure 3:
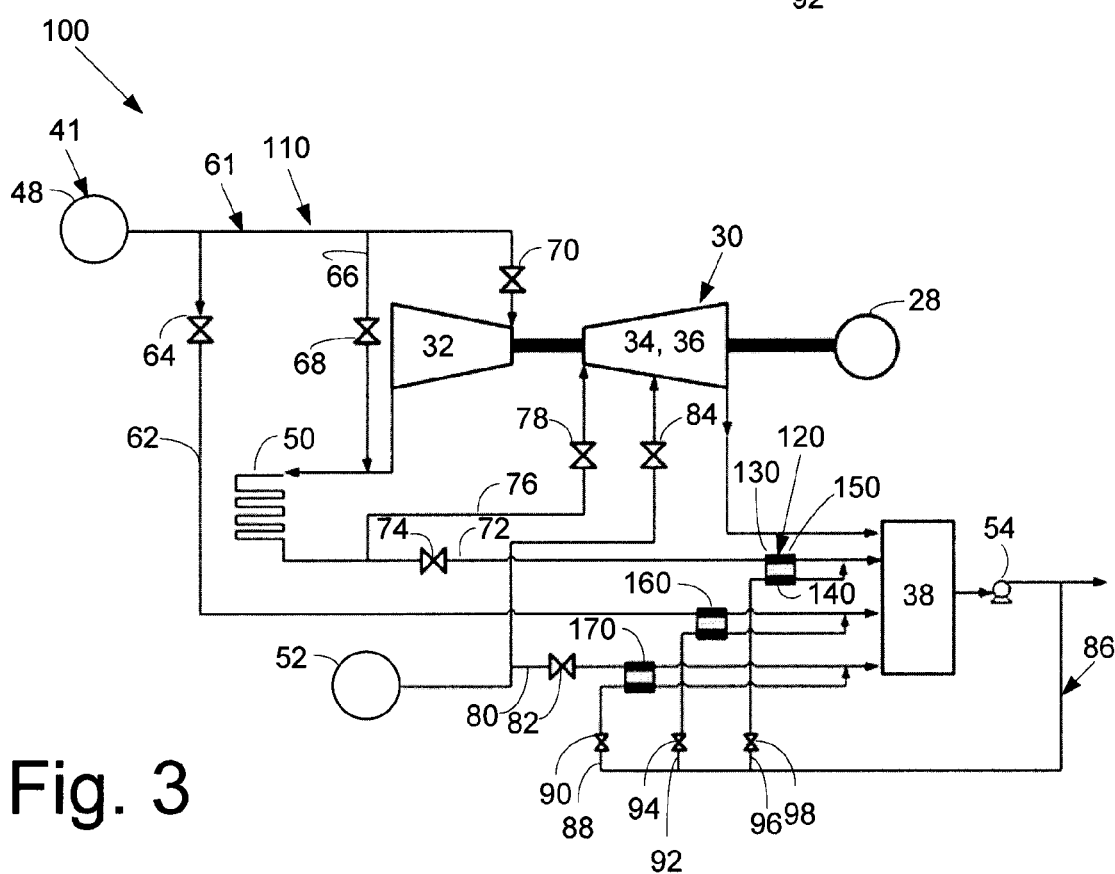
FIG. 3 is a schematic diagram of a portion of a combined cycle system as may be described herein with a steam turbine bypass system and a number of thermoelectric generators.

FIG. 3 shows a steam cycle system 100 as may be described herein. The steam cycle system 100 may include a steam turbine bypass system 110. Although the configuration may vary, the steam turbine bypass system 110 may be similar to that described above with similar components. The steam turbine bypass system 110 also may include one or more thermoelectric generators 120. Generally described, a thermoelectric generator 120 generates current based upon a temperature difference between two different materials according to the Seebeck effect. A thermoelectric generator 120 may include a hot side 130 and a cold side 140. The thermoelectric generator 120 thus generates a direct current based upon the temperature differences between the hot bypass steam on the hot side 130 and the cooler feed water on the cold side 140. The thermoelectric generators 120 used herein may be of conventional design. Other components and other configurations may be used herein.

Specifically, a high pressure thermoelectric generator 150 may be positioned about the parallel bypass line 62 or other type of high pressure bypass line 61 on the hot side 130 and the high pressure feed water line 92 on the cold side. A hot reheat thermoelectric generator 150 may be positioned about the hot reheat bypass line 72 on the hot side and the hot reheat feed water line 96 on the cold side. Likewise, a low pressure thermoelectric generator 170 may be positioned about the low pressure bypass line 80 on the hot side 130 and the low pressure condensate water line 88 on the cold side. The thermoelectric generators 120 may generate power for any use.

Although one thermoelectric generator 120 is shown about each of the bypass lines 62, 72, 80, any number of the thermoelectric generators 120 may be used about each line or elsewhere. The thermoelectric generators 120 may be positioned in series or in parallel to manipulate the overall power output. Likewise, not all of the bypass lines 62, 72, 80 necessarily may have a thermoelectric generator 120 thereon. The thermoelectric generators 120 may be positioned about any temperature differential within the overall steam cycle system 100. Other components and other configurations may be used herein.

Use of the thermoelectric generators 120 thus generates power from the otherwise wasted heat of the bypass flows. Moreover, the thermoelectric generators 120 have no moving parts so as to minimize operating expenses. Given such, there are few operation or control concerns in running the thermoelectric generators 120 in power generation mode. The use of the thermoelectric generators 120 also reduces attemperator size and condensate water consumption in that some of the thermal energy of the bypass flows is recovered into electrical energy. The thermoelectric generators 120 may be installed on existing bypass systems 110.

Although the steam cycle system 100 described herein has been explained in the context of a combined cycle system, the overall bypass system 110 may be applicable to almost any type of vapor cycle system. For example, a coal fired steam cycle, a nuclear generator steam system, and similar systems may be used herein.

Figure 4:
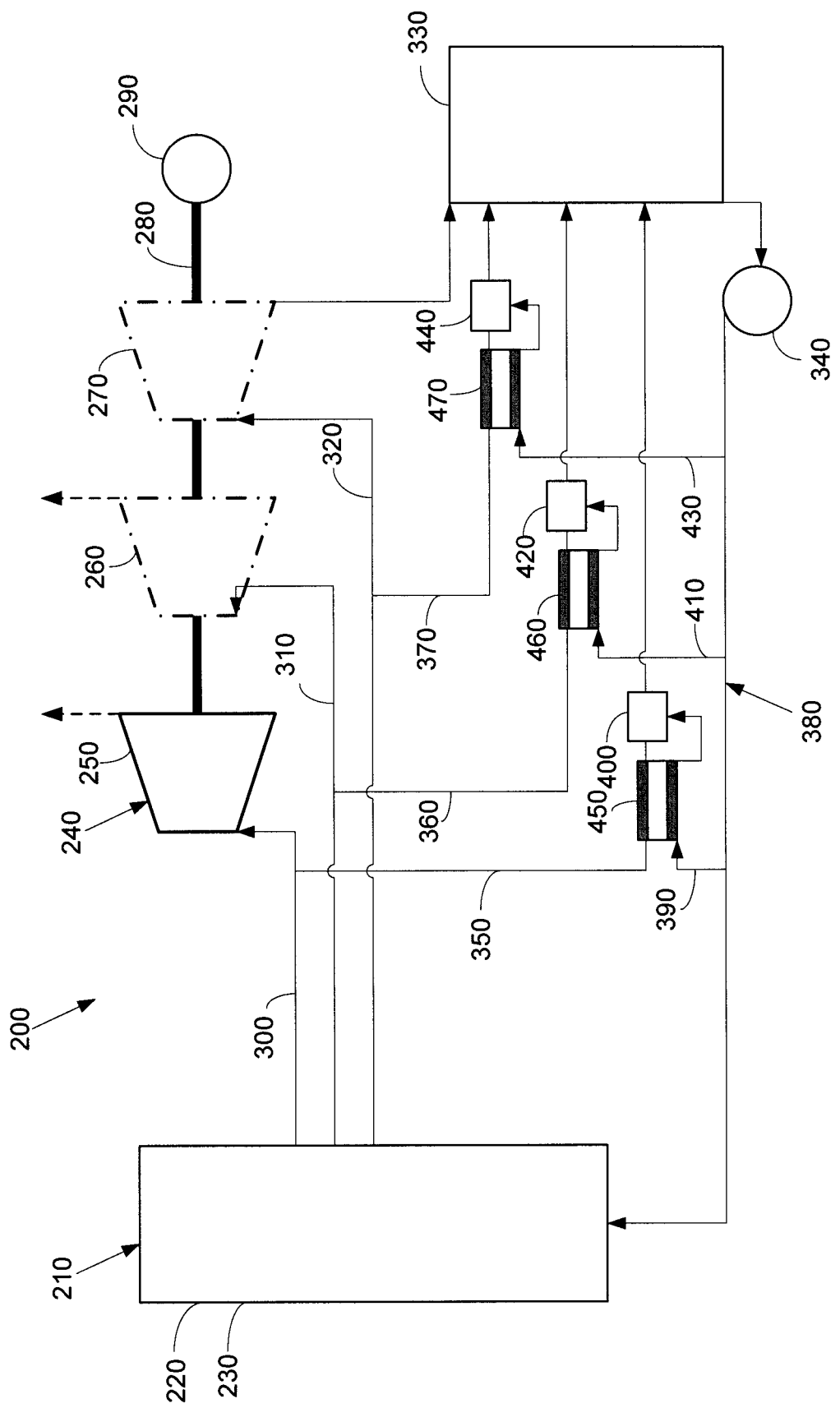
FIG. 4 is a schematic diagram of a vapor cycle system with a bypass system and a number of thermoelectric generators.

For example, FIG. 4 shows a further embodiment of a bypass system 200 as may be described herein. The bypass system 200 may be applicable to any type of steam or vapor cycle system 210. Generally described, the vapor cycle system 210 includes any type of a heat source 220. In this example, the heat source 220 may be an evaporator 230 and the like. The evaporator 230 may heat any type of working fluid for expansion in a number of expanders 240 in parallel or in series (i.e., different operating pressure.) In this example, a first expander 250, a second expander 260, and a third expander 270 are shown although any number of the expanders 240 may be used herein. The expanders 240 may drive a shaft 280. In turn, the shaft 280 may drive any type of load 290 such as an electrical generator and the like. The evaporator 230 may be in communication with the first expander 250 via a first line 300, the second expander 260 may be in communication with the evaporator 230 via a second line 310, and the third expander 270 may be in communication with the evaporator 230 via a third line 320. The working fluid may return to the evaporator 230 via a condenser 330 and a condensate pump 340. Other components and other configurations also may be used herein.

The bypass system 200 may include a first bypass line in communication with the first line 300 and the condenser 330, a second bypass line 360 in communication with the second line 310 and the condenser 330, and a third bypass line 370 in communication with the third line 320 and the condenser 330. Any number of the bypass lines may be used herein. The bypass lines 350, 360, 370 may be in communication with an attemperating water line 380 in communication with the condenser 330 and the condensate pump 340. A first attemperating water line 390 may be in communication with the first bypass line 350 via a first attemperator 400, a second attemperating line 410 may be in communication with the second bypass line 360 via a second attemperator 420, and a third attemperating line 430 may be in communication with the third bypass line 370 via a third attemperator 440. Other components and other configurations may be used herein.

The bypass system 200 also may include one or more of the thermoelectric generators 120. A first thermoelectric generator may be positioned about the first bypass line 350 and the first attemperating line 390, a second thermoelectric generator 460 may be positioned about the second bypass line 360 and the second attemperating line 410, and a third thermoelectric generator 470 may be positioned about the third bypass line 370 and the third attemperating line 430. Any number of the thermoelectric generators 120 may be used herein. The thermoelectric generators 120 may operate as is described above.

The bypass system 200 described herein thus may be used in any type of vapor cycle system 210. Specifically, the bypass system 200 may take advantage of the temperature differentials in any device that involves vapor generation and condensation and the like.

It should be apparent that the foregoing relates only to certain embodiments of the present application and the resultant patent. Numerous changes and modifications may be made herein by one of ordinary skill in the art without departing from the general spirit and scope of the invention as defined by the following claims and the equivalents thereof.

We claim:

1. A steam cycle system, comprising:
a source of steam;
a steam turbine;
a condenser;
a steam turbine bypass system comprising at least two parallel bypass lines such that steam from the source of steam may bypass the steam turbine and be routed to the condenser, and a feed water line in communication with the condenser and at least one of the at least two parallel bypass lines; and
one or more thermoelectric generators comprising a hot side positioned in thermal communication with one of the at least two parallel bypass lines of the steam turbine bypass system and a cold side positioned in thermal communication with the feed water line of the steam turbine bypass system.

2. The steam cycle system of claim 1, wherein the source of steam comprises a source of high pressure steam, wherein the steam turbine comprises a high pressure section, and wherein the at least two parallel bypass lines of the steam turbine bypass system comprise high pressure bypass lines.

3. The steam cycle system of claim 2, wherein the source of high pressure steam comprises a superheater.

4. The steam cycle system of claim 2, wherein the feed water line of the steam turbine bypass system comprises a high pressure feed water line in communication with the condenser and one of the high pressure bypass line.

5. The steam cycle system of claim 4, wherein the cold side of the one or more thermoelectric generators is positioned in thermal communication with the high pressure feed water line.

6. The steam cycle system of claim 2, wherein the at least two parallel bypass lines comprise a cascade bypass line in a cascade arrangement with at least one of the high pressure bypass lines, wherein the steam turbine bypass system comprises a hot reheat bypass line in communication with the cascade bypass line and a hot reheat feed water line in communication with the condenser and the hot reheat bypass line.

7. The steam cycle system of claim 6, wherein the cascade bypass line and the hot reheat bypass line are in communication via a reheater, wherein the reheater is positioned in between the cascade bypass line and the hot reheat bypass line.

8. The steam cycle system of claim 6, wherein the one or more thermoelectric generators comprise a hot side positioned about the hot reheat bypass line and a cold side positioned in thermal communication with the hot reheat feed water line.

9. The steam cycle system of claim 1, wherein the source of steam comprises a source of low pressure steam and wherein the at least two parallel bypass lines of the steam turbine bypass system comprise low pressure bypass lines.

10. The steam cycle system of claim 9, wherein the feed water line of the steam turbine bypass system comprises a low pressure condensate water line in communication with the condenser and one of the low pressure bypass lines.

11. The steam cycle system of claim 10, wherein the one or more thermoelectric generators comprise a hot side positioned in thermal communication with the low pressure bypass line and a cold side positioned in thermal communication with the low pressure condensate water line.

12. The steam cycle system of claim 9, wherein the source of low pressure steam comprises a low pressure superheater.

13. The steam cycle system of claim 1, wherein the one or more thermoelectric generators comprise a high pressure thermoelectric generator, a hot reheat thermoelectric generator, and/or a low pressure thermoelectric generator.

14. The steam cycle system of claim 1, further comprising a condensate pump in communication with the condenser.

15. A method of producing supplemental power in a steam cycle system, comprising:
routing hot steam through a bypass line in a steam turbine bypass system, wherein the hot steam is routed from a source of steam to a condenser and bypass a steam turbine, and the steam turbine bypass system comprises at least two parallel bypass lines;

routing feed water in a feed water line to merge with the hot steam in the bypass line of the steam turbine bypass system, wherein the feed water line is in communication with the condenser and at least one of the at least two parallel bypass lines;

positioning a thermoelectric generator in the thermal communication with the bypass line and the feed water line; and generating power based upon a temperature difference between the hot steam and the feed water.

16. A vapor cycle system, comprising:
a heat source;
one or more expanders;
a condenser;
a bypass system with at least two parallel bypass lines and a feed water line in communication with the condenser and at least one of the at least two parallel bypass lines, such that vapor from the heat source may bypass the one or more expanders and be routed to the condenser; and
one or more thermoelectric generators comprising a hot side positioned in thermal communication with one of the at least two parallel bypass lines of the bypass system and a cold side positioned in thermal communication with the feed water line of the steam turbine bypass system.

17. The vapor cycle system of claim 16, wherein the heat source comprises an evaporator.

18. The vapor cycle system of claim 16, wherein bypass system comprises a plurality of attemperating lines.

19. The vapor cycle system of claim 18, wherein the bypass system comprises a plurality of bypass lines.

20. The vapor cycle system of claim 19, wherein the one or more thermoelectric generators comprise a hot side positioned in thermal communication with the plurality of bypass lines and a cold side positioned in thermal communication with the plurality of attemperating lines.

* * * * *